United States Patent [19]

Johnson et al.

[11] 4,264,358

[45] Apr. 28, 1981

[54] SEMICONDUCTING GLASSES WITH FLUX PINNING INCLUSIONS

[75] Inventors: William L. Johnson, Pasadena; Siu-Joe Poon, Palo Alto; Pol E. Duwez, Pasadena, all of Calif.

[73] Assignee: California Institute of Technology, Pasadena, Calif.

[21] Appl. No.: 11,217

[22] Filed: Feb. 12, 1979

[51] Int. Cl.² ............... C22C 27/04; C22C 30/00
[52] U.S. Cl. .................. 75/134 F; 75/134 V; 75/176
[58] Field of Search ........... 75/134 R, 134 V, 134 F, 75/174, 176, 177

[56] References Cited

U.S. PATENT DOCUMENTS

| | | | |
|---|---|---|---|
| 4,059,441 | 11/1977 | Ray et al. | 75/174 |
| 4,116,687 | 9/1978 | Hasegawa | 75/150 |
| 4,133,679 | 1/1979 | Ray | 75/176 |
| 4,133,681 | 1/1979 | Ray | 75/176 |
| 4,133,682 | 1/1979 | Ray | 75/176 |
| 4,137,075 | 1/1979 | Ray et al. | 75/174 |

Primary Examiner—L. Dewayne Rutledge
Assistant Examiner—Peter K. Skiff
Attorney, Agent, or Firm—Marvin E. Jacobs

[57] ABSTRACT

A series of amorphous superconducting glassy alloys containing 1% to 10% by volume of flux pinning crystalline inclusions have been found to have potentially useful properties as high field superconducting magnet materials. The alloys are prepared by splat cooling by the piston and anvil technique. The alloys have the composition $(TM)_{90-70}(M)_{10-30}$ where TM is a transition metal selected from at least one metal of Groups IVB, VB, VIB, VIIB or VIIIB of the Periodic Table such as Nb, Mo, Ru, Zr, Ta, W or Re and M is at least one metalloid such as B, P, C, N, Si, Ge or Al.

8 Claims, 3 Drawing Figures

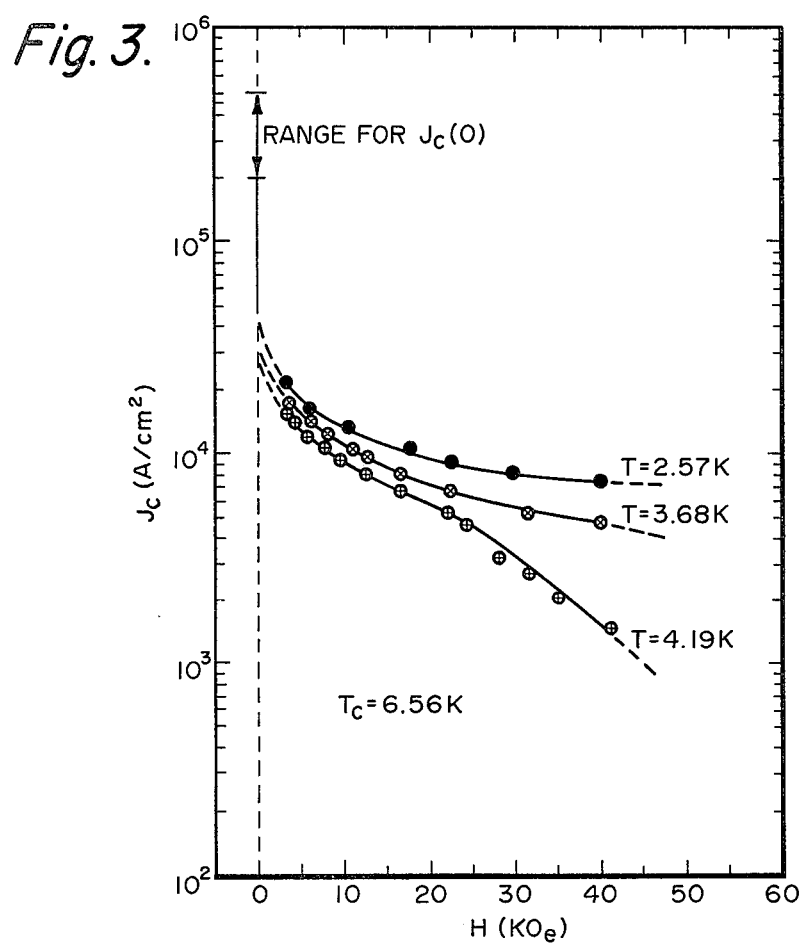

SEMICONDUCTING GLASSES WITH FLUX PINNING INCLUSIONS

ORIGIN OF THE INVENTION

The invention described herein was made in the performance of work under a Department of Energy contract.

BACKGROUND OF THE INVENTION

1. Field of the Invention:

The present invention relates to amorphous superconducting alloys containing a major amount of a transition metal and, more particularly, to metal glasses containing a small amount of small crystalline flux pinning centers.

2. Description of the Prior Art:

A useful material for superconducting magnet windings must possess the following properties:

(a) The material must be produced in the form of wires or ribbons suitable for winding a magnet;

(b) The mechanical properties of the material must be such that the material can be bent during winding. Brittle materials are not desirable;

(c) The superconducting transition temperature must be well above 4.2° K. to allow for convenient operation in liquid helium;

(d) The upper critical field $H_{c2}$ at 4.2° K. must be greater than the field at which the magnet is expected to operate;

(e) The critical current density $J_c$ in the expected operating field must be large-typically of order $10^5$ A/cm$^2$ for fields in the 100 KOe range.

Present commercial superconducting alloys used for superconducting wires for magnet windings are crystalline NbTi and Nb$_3$Sn, alloys. The superconducting transition temperature, critical field and critical current density for these alloys are presented in Table 1, below

| Alloy Composition | Tc(K) | $H_{c2}$, T = 4.2 (KOe) | Jc 1 = 50 KOe |
|---|---|---|---|
| NbTi | 9-10 | 120 | $10^5$ A/cm$^2$ |
| Nb$_3$Sn | 18 | 220 | $10^6$ A/cm$^2$ |

NbTi exhibits limited ductility and Nb$_3$Sn exhibits essentially no ductility. Both alloys require very difficult ribbon fabrication procedures. NbTi is cast into ingots, cold worked and drawn into ribbons. Nb$_3$Sn must be drawn dispersed in a ductile copper matrix since it has no ductility by itself. Both of these alloys are very susceptible to damage in a thermal neutron environment requiring shielding when used as magnets for plasma fusion devices, the transition temperature dropping to about 3 K.

Amorphous superconductors readily prepared by liquid quenching in the forms of wires and ribbons have been shown to be ductile and flexible, have transition temperatures in the range of 9°-10° K. and critical fields ranging up to 200 KOe. However, the critical current density in the expected operation field is too low to be practical.

SUMMARY OF THE INVENTION

It has now been discovered in accordance with this invention that enhanced critical current densities of greater than $3 \times 10^4$ A/cm$^2$ at H=50 KOe can be achieved in the amorphous superconductors by controlled introduction of crystalline phase precipitates or other inhomogeneity into the amorphous matrix. The resulting composite material exhibits flux pinning behavior which is responsible for the enhanced $J_c$ values in high field. The alloys are expected to have high radiation tolerance since other amorphous superconducting alloys are not subject to degradation and some of these alloys exhibit increased Tc in a high radiation environment.

The composite materials are fabricated by liquid quenching of the alloys. The alloys are prepared in bulk form by conventional metallurgical techniques such as powder sintering; induction melting; etc. The liquid bulk material is then fabricated in one step into a superconducting material by simultaneously quenching the material while forming it into a thin, high strength, flexible ribbon or foil. The bulk alloys melt at temperatures from 1000° C. to 1800° C. The quenching rate should be very fast such as $10^5$ to $10^6$ °C./sec to form amorphous superconducting alloys since crystalline alloys of the same empirical composition are not superconducting at temperatures of interest.

Small, thin foils can be produced in the laboratory by pressing a molten drop between a hammer and a massive very conductive anvil heat sink. Continous ribbons can be produced commercially by the Liebermann-Graham roller quenching technique in which the liquid alloy is fed from a nozzle to a rapidly rotating drum which results in a continuous ribbon of well-characterized dimensions. The quenched material may be totally amorphous in which case subsequent heat treatment of the metastable amorphous glass is required at a temperature sufficient to induce crystalline nuclei to form in the amorphous matrix, typically 40% of the melting temperature of the alloy at the glass forming composition.

Alternatively, the composition of the initial bulk, liquid material is chosen to lie outside of the limits for which liquid quenching yields a single amorphous phase. In this case, the quenched, liquid material, contains small, finely dispersed, crystalline precipitates. The size, number, distribution of and properties of the precipitates affects the optimum flux pinning strength, mechanical properties and current carrying capacity of the continuous ribbons of composite superconductor prepared in accordance with this invention will have desirable mechanical properties such as flexibility and high strength contributed by the amorphous matrix which is the major component of the material. The ribbon is a suitable form for use in winding superconducting magnets intended for use in plasma fusion devices.

As discussed, the amount, size, dispersion and character of the precipitates all affect the final properties of the composite. At least 1% by volume of crystalline precipitates are required to provide a significant increase in current carrying capacity. Precipitates in an amount above 10% result in excessive degradation of the desirable strength, ductility and flexibility of the amorphous, glassy matrix. The superconducting properties of the precipitate phase should be different from those of the amorphous matrix. The transition temperature, for example, should be significantly higher or lower than that of the amorphous matrix so as to obtain the highest Jc for the composite. Though the phase of the precipitate is important, the shape need not be uniform or spherical. The density or number per unit volume is an important parameter since this also defines the average distance between precipitates. Smaller particles of the order of 25 Å to 500 Å, preferably 50 Å to 250 Å are desirable to obtain optimum pinning of flux and large Jc. Some samples containing precipitates having a diameter from 1000 Å to 2000 Å showed poor mechanical and superconducting properties.

The chemical composition of the bulk alloys are selected from alloys of the general formula:

$$(TM)_{90-70}(M)_{10-30}$$

where TM is at least one transition metal selected from Groups IVB, VB, VIB, VIIB and VIIIB of the Periodic Table and M is an amphoteric metalloid such as B, P, C, N, Si, Ge, Al and mixtures thereof, preferably B, P, C and Si. Exemplary transition metals are Nb, Mo, Ru, Ta, W, Re, preferably Mo, Ru, W and Re. Preferred amorphous composites are formed from particular classes of ternary or quarternary alloys as follows:

(a) $(Mo_{1-x}Ru_x)_m (B_y Si_{1-y})_{100-m}$
(b) $(Mo_{1-x}Re_x)_m (B_y Si_{1-y})_{100-m}$
(c) $(Mo_{1-x-z}Nb_x Re_z)_m (B_y Si_{1-y})_{100-m}$ where m is a mole percent from 75 to 85, usually about 80, x is a fraction from 0.1 to 0.8, preferably from 0.3 to 0.5, y is a fraction from 0.1 to 0.8, preferably from 0.2 to 0.4, and z is a fraction from 0.1 to 0.8, preferably from 0.4 to 0.6.

These and many other features and attendant advantages of the invention will become apparent as the invention becomes better understood by reference to the following detailed description when considered in conjunction with the accompanying drawings.

BRIEF DESCRIPTION OF THE DRAWINGS

FIG. 3 is a series of graphs of critical current as a function of applied field for amorphous $(Mo_{0.6}Ru_{0.4})_{80}Si_{10}B_{10}$ containing crystalline inclusions at various Tc temperatures.

DESCRIPTION OF THE PREFERRED EMBODIMENTS

Figure 1:
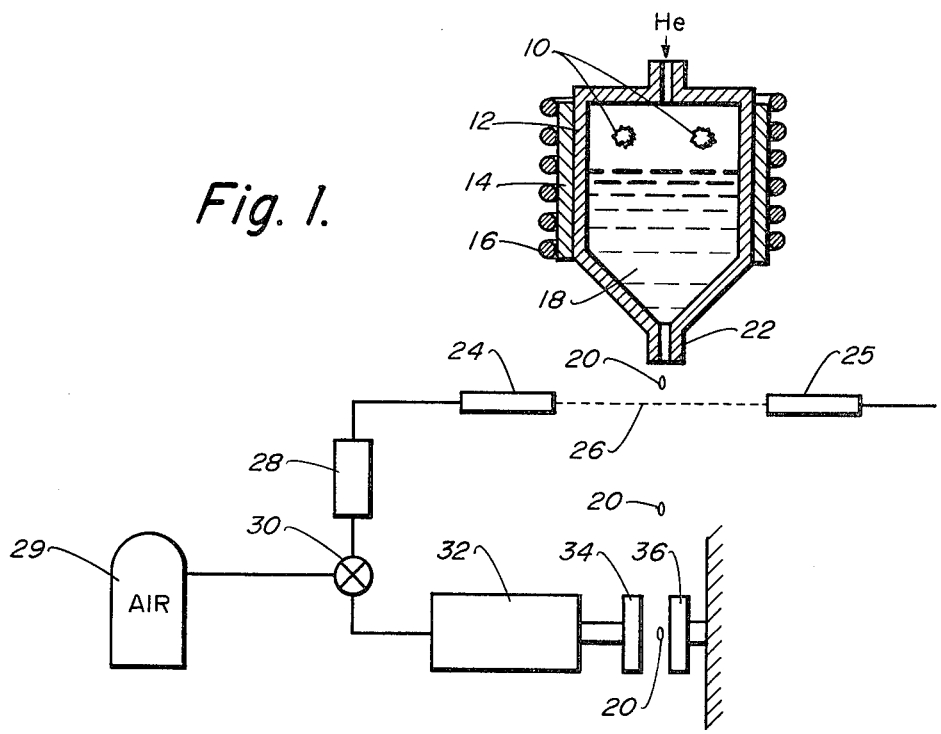
FIG. 1 is a schematic drawing of a hammer and anvil splat quenching apparatus for fabricating superconducting composite foils.

Samples of foils having a thickness of about 50μ and an area of 2–3 cm² were prepared by induction melting of the appropriate constituents on a silver boat under an argon atmosphere. The ingots obtained were subsequently broken into pieces and processed into foils in the apparatus of FIG. 1. Pieces 10 of the bulk alloy were placed in a quartz nozzle 12 surrounded by a graphite susceptor 14. The pieces were melted in a helium atmosphere to form liquid 18 by energizing induction coil 16 by means of a power source, not shown. When a drop 20 of molten alloy was ejected from the nozzle tip 22 by a pulse of helium, a photocell 24 was deactivated by blocking the beam 20 of light from lamp 24 as the drop 20 fell through the beam 26.

The deactivation of the photocell in turn resulted in the activation of a servomechanism such as a solenoid 28 which opened a valve 30 admitting high pressure gas into a chamber 32 behind a driving anvil or piston 34. The freely falling drop is caught between the face of the piston 34 and an opposed and stationary anvil 36, both anvils being made of high polished, heat conductive copper. The resulting foils are approximately circular. The thickness can be varied by changing the driving pressure.

The foils obtained have an area of 1–3 cm² and a thickness of about 50 μ. The structure of each foil was preliminarily checked by x-ray diffraction scanning to determine whether or not significant crystallization had occurred during quenching. Alloys containing 80 at. % of Mo and Ru along with 20 at. % of the metalloid elements P, B, Al, and Si were studied. In Table II, the composition, $T_c$, and critical field gradient $(dH_{c2}/dT)_{Tc}$ are listed for several of the alloys studied.

TABLE

| Alloy Composition | $T_c(K)$ | $\frac{dH_{c2}}{dT}$ $\frac{KOe}{T_c}$ K | Structure |
|---|---|---|---|
| $(Mo_{.6}Ru_{.4})_{80}B_{20}$ | 5.9 | 28 ± 2 | Amorphous |
| $(Mo_{.6}Ru_{.4})_{80}P_{10}B_{10}$ | 6.2 | 25 ± 2 | Amorphous |
| $(Mo_{.6}Ru_{.4})_{80}Si_{10}B_{10}$ | 6.6 | 25 ± 3* | Amorphous + crystalline inclusions |

*extrapolated

For the alloy $(Mo_{0.6}Ru_{0.4})_{80}Si_{10}B_{10}$, all samples that were obtained showed evidence of crystalline phase precipitation in both x-ray diffraction and electron diffraction. The alloys $(Mu_{0.6}Ru_{0.4})_{80}B_{20}$, $(Mo_{0.6}Ru_{0.4})_{80}P_{10}B_{10}$, and $(Mo_{0.6}Ru_{0.4})_{80}Al_{10}B_{10}$ could be obtained as a single phase amorphous material having no detectable crystalline inclusions by either diffraction method.

Critical current densities were measured on strips of these foils having a length of 1–2 cm and a width of 1–3 mm. The ends of the specimens were spot welded to gold pads that were soldered to copper bars which served as current leads. Separate voltage leads were spot welded along the sample strip away from the gold pads. The assembly was immersed directly in liquid helium and located in the bore of Nb-Ti superconducting solenoid capable of generating magnetic fields up to 45 KOe. The magnetic field was applied transverse to the direction of current flow along the sample strip and the critical current of the specimen was defined as the maximum current for which no detectable voltage drop (1 μV) occurred across the voltage leads. Following the critical current measurements, small disks were cut from the same sample strip, chemically thinned, and studied by transmission electron diffraction and microscopy. A comparison of results from x-ray diffraction and electron diffraction on the same foil indicate the latter to be a more flexible technique for observing crystalline inclusions.

Figure 2:
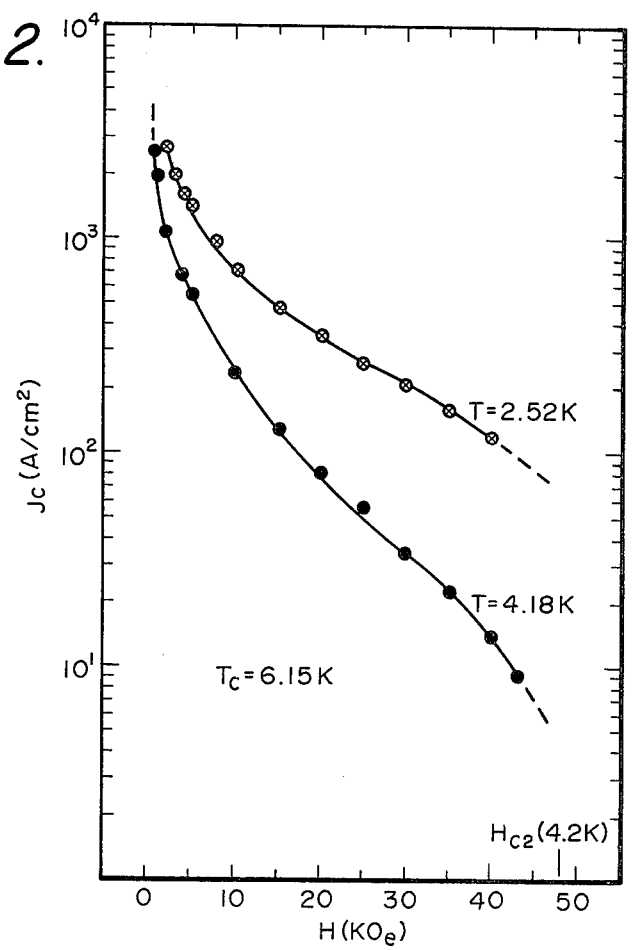
FIG. 2 is graph of critical current as a function of applied field for an amorphous $(Mo_{0.6}Ru_{0.4})_{80}P_{10}B_{10}$ specimen.

FIG. 2 shows the critical current $J_c(H,T)$ as a function of H at several fixed values of T for an amorphous $(Mo_{0.6}Ru_{0.4})_{80}P_{10}B_{10}$ specimen containing no evidence of crystalline inclusions. For H=0 and T=4.2 k, $J_c$ is found to be of order $2\times10^5$ A/cm². For H>0, $J_c$ is observed to fall very rapidly with increasing H. For example, at $H\approx0.5$ $H_{c2}$, $J_c$ is in the range of 10–100 A/cm². Such a small value of $J_c$ indicates that flux pinning forces in this material are comparatively weak. The structure of this sample was studied both by x-ray diffraction and electron diffraction methods. A broad first band is observed at low angle followed by a series of bands with rapidly decreasing intensity at high angle.

No evidence of crystallization is seen. To further substantiate this observation, a small disk of the material was cut from the critical current specimen, chemically thinned, and used for transmission electron diffraction. A typical region of the thinned specimen a shown in an electron micrograph shows uniformity indicating a single phase material. A characteristic electron diffraction pattern of this region have a series of diffuse halos indicating that the material is amorphous. No evidence of crystalline inclusions was found in the specimen. Crystalline inclusions having dimensions of $\gtrsim 50$ Å can be detected by this method.

FIG. 3 shows the critical current density $J_c(H,T)$ as a function of H at several fixed temperatures for an amorphous $(Mo_{0.6}Ru_{0.4})_{80}Si_{10}B_{10}$ sample which was shown to contain crystalline inclusions. Critical current densities of order $10^4$ A/cm$^2$ are observed over a broad range of H. The critical current decreases much more slowly with increasing field by comparision with that shown in FIG. 1. For H=0, $J_c(0,T)$ was found to be of order $2 \times 10^5$ A/cm$^2$. The $J_c$ vs. H curve indicates substantial flux pinning forces. An x-ray diffraction pattern of this material demonstrates that unlike that of amorphous $(Mo_{0.6}Ru_{0.4})_{80}P_{10}B_{10}$, this pattern shows small but clearly visible peaks superimposed on the first broad band. These peaks indicate the presence of crystalline inclusions in the amorphous matrix. The fraction of such material can be roughly determined by estimating the ratio of the integrated area under these peaks and comparing it to the area of the broad band on which they are superimposed. Using this procedure gives an estimate of 2-4% for the fraction of crystallized material. A small disk cut from the critical current specimen was thinned and studied by electron diffraction and microscopy as before. The electron micrograph shows a typical region. A uniform distribution of precipitate particles can be seen throughout the specimen. The particles have a characteristic dimension of 100-200 Å and are regularly dispersed throughout the sample. An electron diffraction pattern was taken with a beam diameter ~1000 Å. A series of broad halos can be seen along with a very large number of weak diffraction spots superimposed on the halos. This confirms the previous conclusion that the amorphous matrix contains crystalline inclusions and shows that these inclusions are rather uniformily dispersed throughout the amorphous matrix. From the electron micrograph, the volume fraction of the crystalline inclusions can be roughly estimated to be 1-4%. This is in reasonable agreement with estimates based on x-ray diffraction.

A series of studies of the type described above have been carried out on numerous other specimens of the $(Mo_{0.6}Ru_{0.4})_{80}P_{20-x}B_x$ and $(Mo_{0.6}Ru_{0.4})_{80}Si_{20-x}B_x$ alloy series. The results are very similar to those obtained for the two alloys discussed above. The main features of the results can be summarized as follows. (1) Amorphous samples having no evidence of crystalline phase precipitation have values of $J_c(H,T)$ of order $10^5$ A/cm$^2$ for H−0 and exhibit rapidly decreasing $J_c(H,T)$ for H values which are a significant fraction of $H_{c2}(T)$. Typical critical currents for $H > 0.5\ H_{c2}(T)$ are of order $10^2$ A/cm$^2$. (2) Samples containing crystalline inclusions constituting several percent of the sample by volume show comparable critical current densities for H=0. For H>0, the critical current shows a substantial enhancement (by a factor of 100-1000) over that obtained for an amorphous sample with no inclusions. Critical current values as high as $3 \times 10^4$ A/cm$^2$ at H=40 KOe and T=2.5 K have been measured for partially crystalline $(Mo_{0.6}Ru_{0.4})_{80}P_{20}$ samples. Electron diffraction studies of these samples indicate that the crystalline inclusions have a comparatively larger characteristic dimension ranging up to 1000-2000 Å. Substantial embrittlement of the samples containing such large inclusions was evident from the fact that the specimens were difficult to handle without breaking. No noticeable embrittlement was observed for $(Mo_{0.6}Ru_{0.4})_{80}Si_{10}B_{10}$ samples with smaller precipitates particles.

It is to be realized that only preferred embodiments of the invention have been described and that numerous substitutions, alterations or modifications are possible without departing from the spirit or scope of the invention as defined in the claims.

What is claimed is:

1. Amorphous, superconducting, glassy alloys of the formula:

$$(TM)_{90-70}(M)_{10-30}$$

where TM is a transition metal mixture selected from the group consisting of MORu, MoRe or MoNbRe and M is a metalloid selected from B, P, C and Si, said alloys containing a dispersion of 1% to 10% by volume of flux pinning, crystalline inclusions having a diameter from 25 angstroms to 2000 angstroms.

2. An alloy according to claim 1 where M is a mixture of B and Si.

3. An alloy according to claim 2 selected from compounds of the formula:

$$(Mo_{1-x}Ru_x)_m(B_ySi_{1-y})_{100-m}$$

$$(Mo_{1-x}Re_x)_m(By\ Si_{1-y})_{100-m}$$

or $$(Mo_{1-x-y}Nb_xRe_z)_m(By\ Si_{1-y})_{100-m}$$

where m is a mole percent from 75 to 85, x is a fraction from 0.1 to 0.8, y is a fraction from 0.1 to 0.8 and z is a fraction from 0.1 to 0.8.

4. An alloy according to claim 3 of the formula $(Mo_{0.6}Ru_{0.4})_{80}Si_{10}B_{10}$.

5. An alloy according to claim 1 in which the crystalline inclusions have a diameter from 50 Å to 250 Å.

6. An alloy according to claim 1 in which the crystalline inclusions are uniformly distributed throughout the amorphous matrix.

7. An alloy according to claim 1 in the form of a thin ribbon.

8. An alloy according to claim 1, where the atomic percent of (M) is from 15 to 25.

* * * * *

UNITED STATES PATENT AND TRADEMARK OFFICE
CERTIFICATE OF CORRECTION

PATENT NO. : 4,264,358
DATED : April 28, 1981
INVENTOR(S) : William L. Johnson, Siu-Joe Poon, Pol Edgard Duwez It is certified that error appears in the above-identified patent and that said Letters Patent are hereby corrected as shown below:

Page 1, in the title, change "SEMICONDUCTING" to --SUPERCONDUCTING--.

Column 3, line 20, correct "Ru".

Column 4, line 15, after "Table" add --II--.

Column 6, line 30, correct "Mo".

Signed and Sealed this

Sixteenth Day of November 1982

[SEAL]

Attest:

Attesting Officer

GERALD J. MOSSINGHOFF
Commissioner of Patents and Trademarks